(12) United States Patent
Joshi et al.

(10) Patent No.: US 8,929,074 B2
(45) Date of Patent: Jan. 6, 2015

(54) ELECTRONIC DEVICE ASSEMBLIES AND VEHICLES EMPLOYING DUAL PHASE CHANGE MATERIALS

(75) Inventors: Shailesh N. Joshi, Ann Arbor, MI (US); Ercan Mehmet Dede, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 214 days.

(21) Appl. No.: 13/561,229

(22) Filed: Jul. 30, 2012

(65) Prior Publication Data

US 2014/0029203 A1  Jan. 30, 2014

(51) Int. Cl.
H05K 7/20 (2006.01)

(52) U.S. Cl.
USPC ........... 361/700; 361/689; 361/698; 361/699; 165/80.4; 257/712; 257/713; 257/714

(58) Field of Classification Search
None
See application file for complete search history.

(56) References Cited

U.S. PATENT DOCUMENTS

| | | | |
|---|---|---|---|
| 5,315,154 A * | 5/1994 | Elwell | 257/707 |
| 5,455,458 A * | 10/1995 | Quon et al. | 257/714 |
| 6,064,572 A | 5/2000 | Remsburg | |
| 6,212,074 B1 * | 4/2001 | Gonsalves et al. | 361/717 |
| 6,400,565 B1 * | 6/2002 | Shabbir et al. | 361/679.54 |
| 6,549,407 B1 * | 4/2003 | Sauciuc et al. | 361/699 |
| 6,996,996 B1 * | 2/2006 | Cader | 62/118 |
| 7,205,653 B2 * | 4/2007 | Brandenburg et al. | 257/714 |
| 7,246,940 B2 | 7/2007 | Storm et al. | |
| 7,266,969 B2 | 9/2007 | Hsu et al. | |
| 7,515,418 B2 * | 4/2009 | Straznicky et al. | 361/702 |
| 7,612,447 B2 * | 11/2009 | Ward et al. | 257/712 |
| 7,646,606 B2 * | 1/2010 | Rytka et al. | 361/704 |
| 7,686,248 B2 | 3/2010 | Weber et al. | |
| 7,768,782 B2 * | 8/2010 | Cohen | 361/699 |
| 7,808,781 B2 * | 10/2010 | Colgan et al. | 361/699 |
| 7,973,433 B2 * | 7/2011 | Nelson et al. | 307/140 |
| 8,451,600 B1 * | 5/2013 | Ross | 361/679.47 |
| 2005/0285261 A1 | 12/2005 | Prasher et al. | |
| 2007/0133173 A1 * | 6/2007 | Hsiung et al. | 361/699 |
| 2008/0121821 A1 * | 5/2008 | Muka et al. | 250/492.21 |
| 2009/0269521 A1 | 10/2009 | Tuma | |

FOREIGN PATENT DOCUMENTS

WO   WO2011161167 A1   12/2011

* cited by examiner

*Primary Examiner* — Boris Chervinsky
(74) *Attorney, Agent, or Firm* — Dinsmore & Shohl LLP

(57) ABSTRACT

Electronic device assemblies employing dual phase change materials and vehicles incorporating the same are disclosed. In one embodiment, an electronic device assembly includes a semiconductor device having a surface, wherein the semiconductor device operates in a transient heat flux state and a normal heat flux state, a coolant fluid thermally coupled to the surface of the semiconductor device, and a phase change material thermally coupled to the surface of the semiconductor device. The phase change material has a phase change temperature at which the phase change material changes from a first phase to a second phase. The phase change material absorbs heat flux at least when the semiconductor device operates in the transient heat flux state.

19 Claims, 5 Drawing Sheets

ELECTRONIC DEVICE ASSEMBLIES AND VEHICLES EMPLOYING DUAL PHASE CHANGE MATERIALS

TECHNICAL FIELD

The present specification generally relates to electronic device assemblies and, more particularly, to electronic device assemblies having a cooling system that employs dual phase change materials to remove thermal flux.

BACKGROUND

Heat transfer devices may be coupled to a heat generating device, such as a semiconductor device, to remove heat and lower the maximum operating temperature of the heat generating device. Cooling fluid may be used in heat transfer devices to receive heat generated by the heat generating device by convective thermal transfer, and remove such heat from the heat generating device. Other heat transfer devices may remove thermal energy by two-phase heat transfer, wherein coolant fluid is converted from a liquid phase to a gas phase at the location of thermal flux.

Semiconductor devices, such as power semiconductor devices, are typically exposed to both transient and steady-state heat loads. In the transient heat load distribution, the heat flux reaches a high peak value for a short period of time, and then drops to a lower steady state value. However, the design of the cooling system for the electronic device assembly should be such that it can meet both the transient and steady-state heat loads. Designing the cooling system to meet the transient load requirement may result in a system that is cost-prohibitive, oversized, and heavy.

Accordingly, a need exists for alternative cooling systems for electronic device assemblies.

SUMMARY

In one embodiment, an electronic device assembly includes a semiconductor device having a surface, wherein the semiconductor device operates in a transient heat flux state and a normal heat flux state, a coolant fluid thermally coupled to the surface of the semiconductor device, and a phase change material thermally coupled to the surface of the semiconductor device. The phase change material has a phase change temperature at which the phase change material changes from a first phase to a second phase. The phase change material absorbs heat flux at least when the semiconductor device operates in the transient heat flux state.

In another embodiment, an electronic device assembly includes a semiconductor device, a coolant fluid, one or more thermally conductive features, and a phase change material disposed within the one or more thermally conductive features. The semiconductor device includes a surface, and operates in a transient heat flux state and a normal heat flux state. The coolant fluid is thermally coupled to the surface of the semiconductor device, and has a fluid phase change temperature at which the coolant fluid changes to a vapor. The coolant fluid changes to a vapor when the semiconductor device operates at the normal heat flux state or the transient heat flux state. The one or more thermally conductive features are thermally coupled to the surface of the semiconductor device. Each thermally conductive feature of the one or more thermally conductive features defines an enclosure in which the phase change material is disposed. The phase change material has a phase change temperature at which the phase change material changes from a solid to a liquid.

In yet another embodiment, a vehicle includes an electric motor and a power electronics module having an electronic device assembly. The power electronics module is electrically coupled to the electric motor, and includes a semiconductor device having a surface, a coolant fluid thermally coupled to the surface of the semiconductor device, and a phase change material also thermally coupled to the surface of the semiconductor device. The semiconductor device operates in a transient heat flux state and a normal heat flux state. The phase change material has a phase change temperature at which the phase change material changes from a first phase to a second phase. The phase change material absorbs heat flux at least when the semiconductor device operates in the transient heat flux state.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to electronic device assemblies that utilize dual phase change materials to cool a semiconductor device that operates at different heat flux states. For example, the semiconductor device may operate in a transient heat flux state caused by a temporary increase in current passing through the semiconductor device (e.g., initial application of a load to the semiconductor device). The semiconductor device may also operate in a normal heat flux state that corresponds with a steady state operation (e.g., normal, steady state operation of the semiconductor device). The heat flux caused by the transient heat flux state is greater than the heat flux caused by the normal heat flux state. As an example and not a limitation, the transient heat load distribution during the transient heat load state may reach a peak value of approximately 200 W/cm$^2$ for a fraction of a second, and then fall to a lower steady-state value of approximately 100 W/cm$^2$ during the normal heat flux state.

Generally, embodiments utilize a second phase change material as an energy storage device that supplements a main, first phase change material in a dual phase change material system. The second phase change material is configured and placed with respect to a semiconductor device to store energy created by the semiconductor device when it operates in the transient heat flux state. The first phase change material, which in some embodiments is a liquid that impinges a surface of the semiconductor device (active cooling), has a phase change temperature that is greater than a phase change temperature of the second phase change material to cool the semiconductor device during the normal heat flux state. In this manner, embodiments utilize dual phase change materials to effectively cool the semiconductor device during both transient and steady state operations. Various embodiments of electronic devices assemblies having dual phase change materials and vehicles incorporating the same are described in detail below.

Figure 1A:
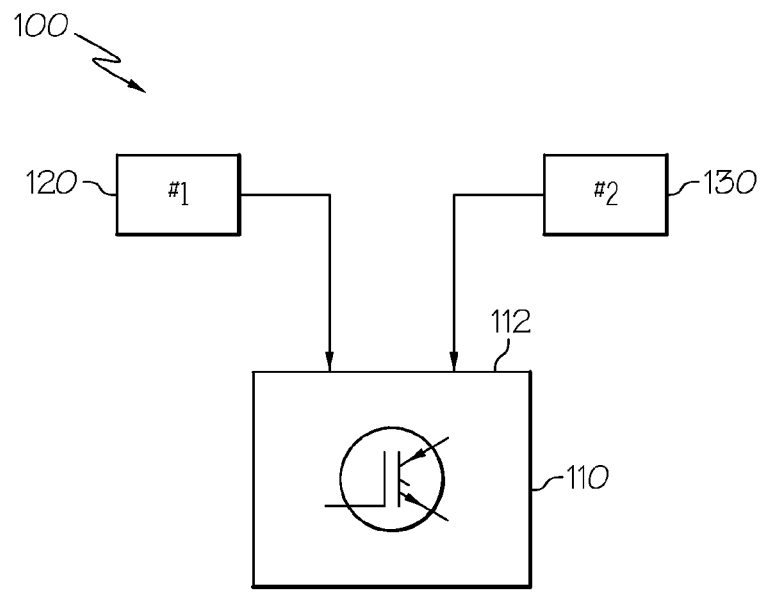
FIG. 1A schematically depicts an exemplary electronic device assembly having dual phase change materials according to one or more embodiments described and illustrated herein.

Referring now to FIG. 1A, an electronic device assembly 100 according to one embodiment is schematically depicted. The electronic device assembly 100 generally comprises a semiconductor device 110 (or other heat generating component) having a surface 112, a first phase change material 120 and a second phase change material 130. The semiconductor device 110 may be configured as a power semiconductor device deployed in a high power application. As an example and not a limitation, the semiconductor device 110 may be included in a power electronic module as a component in an inverter and/or converter circuit used to electrically power high load devices, such as electric motors in electrified vehicles (e.g., hybrid vehicles, plug in hybrid electric vehicles, plug in electric vehicles, and the like). It should be understood that the electronic device assembly 100 may be used in applications other than vehicular applications (e.g., power transmission, machinery, construction equipment, and the like).

Although the semiconductor device 110 is depicted as an insulated gate bipolar transistor (IGBT), the semiconductor device 110 may be configured as any semiconductor device including, but not limited to, MOSFETs, power diodes, power bipolar transistors, and power thyristor devices. The cooling techniques of the embodiments of the present disclosure may also be utilized to cool heat generating devices other than semiconductor devices, such as motors or other mechanical equipment, for example.

The electronic device assembly 100 further comprises a first phase change material 120 and a second phase change material 130 that are thermally coupled to one or more surfaces (e.g., surface 112) of the semiconductor device 110. The first and second phase change materials 120, 130 are configured to change phases at particular temperatures to store thermal energy and remove it from the semiconductor device. As described above, the semiconductor device 110 may operate at a transient heat flux state of high heat flux distribution and a normal heat flux state having a heat flux distribution lower than that of the transient heat flux state. The first phase change material 120 may be configured as a liquid that changes to a vapor at a first phase change temperature. The second phase change material 130 may be configured as a solid that changes to a liquid at a second phase change temperature. As described below, some embodiments utilize the first, liquid phase change material for jet impingement. In such embodiments, the first phase change material may not change to a vapor.

In one embodiment, the first phase change material 120 is a coolant fluid (i.e., a liquid) that is fluidly coupled to the surface 112 of the semiconductor device 110. Examples of the coolant fluid include, but are not limited to, deionized water and engineered fluids, such as HFE-7100. As described in more detail below, the coolant fluid may be provided in a closed system, or in a coolant fluid system wherein the coolant fluid is cycled to and from a coolant fluid reservoir. The second phase change material 130 may be a solid that is thermally coupled to the surface 112 of the semiconductor device 110. The second phase change material 130 may have a phase change temperature that is lower than that of the first phase change material 120, and is configured to change phases from a solid to a liquid when the second phase change temperature is reached. The second phase change material 130 stores the high thermal energy generated by the transient load operation of the semiconductor device 110. The second phase change material 130 may be configured as any material having a phase change temperature that may absorb heat flux generated by operation of the semiconductor device during the transient heat flux state. As an example and not a limitation, the second phase change material 130 may be configured as an energy storage material such as paraffin wax.

In this manner, the transient spikes in the heat load may be absorbed efficiently due to the phase change of the second phase change material, which in turn keeps the semiconductor device 110 temperature at a constant value. While at lower steady state heat loads, the first phase change material may adequately cool the semiconductor device 110 (either by convection, jet impingement, or phase change). Such a dual phase change material approach may lower the overall cost and weight of the cooling system of the electronic device assembly. In some embodiments, particularly embodiments wherein the first phase change material is configured as a coolant fluid that impinges the semiconductor device, the first phase change material may not change to a vapor but rather absorb the thermal energy and remove it by flowing away from the semiconductor device. In other embodiments, the first phase change material removes thermal energy both by jet impingement and phase change.

Figure 1B:
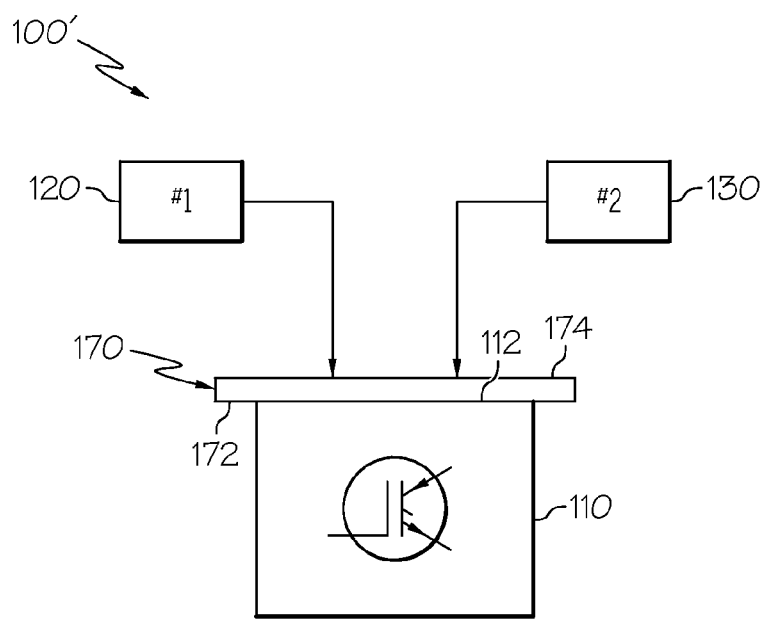
FIG. 1B schematically depicts an exemplary electronic device assembly having a cold plate and dual phase change materials according to one or more embodiments described and illustrated herein.

Referring now to FIG. 1B, an alternative electronic device assembly 100' having an intermediate cold plate 170 positioned between the semiconductor device 110 and the first and second phase change materials 120, 130 is illustrated. The cold plate 170 may be made of a thermally conductive material, examples of which include, but are not limited to, copper, aluminum, and thermally conductive polymers. The semiconductor device 110 may be thermally coupled to a heated surface 172 of the cold plate 170 by any coupling technique, such as by soldering, brazing, and the like. One or more intermediary bonding layers may be present between the surface 112 of the semiconductor device 110 and the heated surface 172 of the cold plate 170. The first and second phase change material 120, 130 may then be thermally coupled to a cooling surface 174 of the cold plate 170.

It should be understood that any of the embodiments described herein may include such an intermediary cold plate even if it is not illustrated in a particular figure. Restated, the cold plate 170 is an optional component that may or may not be included in the electronic device assembly.

Figure 2A:
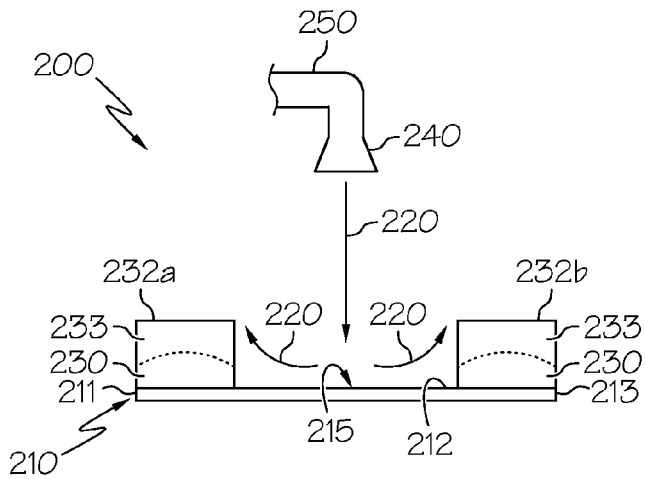
FIG. 2A schematically depicts an elevation view of an exemplary electronic device assembly having dual phase change materials according to one or more embodiments described and illustrated herein.
Figure 2B:
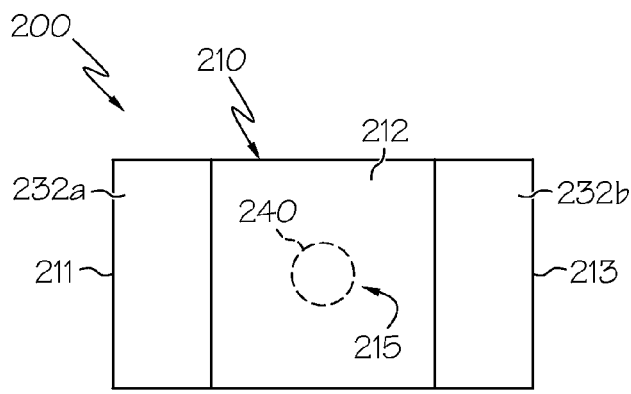
FIG. 2B schematically depicts a top view of the exemplary electronic device assembly depicted in FIG. 2A.
Figure 2C:
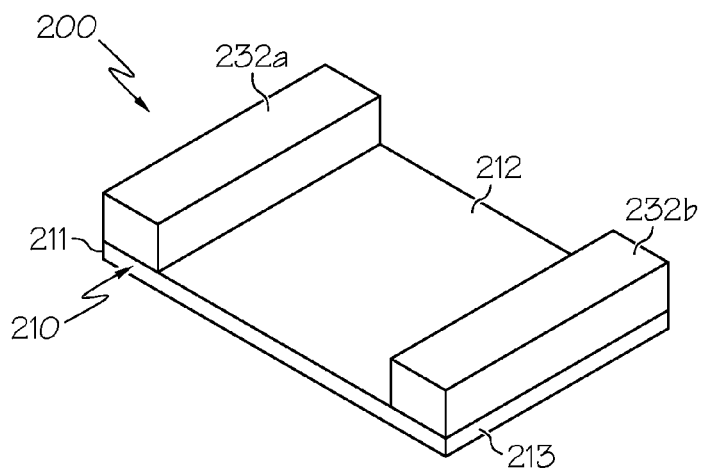
FIG. 2C schematically depicts a perspective view of the exemplary electronic device assembly depicted in FIG. 2A without the jet impingement nozzle.

Referring now to FIGS. 2A-2C, an exemplary electronic device assembly 200 according to one embodiment is illustrated. FIG. 2A is an elevation view, FIG. 2B is a top view, and FIG. 2C is a perspective view of the electronic device assembly 200. The exemplary electronic device assembly 200 is configured as a jet impingement, active cooling system wherein the first phase change material is configured as a coolant fluid 220 that impinges a region 215 of the surface 212 of the semiconductor device 210. The electronic device assembly 200 depicted in FIG. 2A includes a jet impingement nozzle 240 that is fluidly coupled to a fluid line 250. In one embodiment, the fluid line 250 is fluidly coupled to a fluid reservoir (not shown) where it is cooled prior to flowing through the jet impingement nozzle 240. It is noted that the jet impingement nozzle 240 and fluid line 250 are not shown in FIG. 2C for ease of illustration.

The jet impingement nozzle 240 is configured to form a jet of coolant fluid 220 that impinges the surface 212 of the semiconductor device 210 at a region 215 having a high thermal flux distribution. In some cases, the region 215 may be a central region of the surface 212. The coolant fluid 220 strikes the surface 212 of the semiconductor device 210 where it absorbs the thermal energy generated by the semiconductor device 210. Some of the coolant fluid 220 may change from a liquid to a vapor upon contacting the surface 212, thereby cooling the semiconductor device 210 during the normal heat flux state. The coolant fluid vapor and excess coolant fluid 220 may then pass through an outlet (not shown) to be cooled and then recycled back through the jet impingement nozzle 240. Additionally, the electronic device assembly 200 further includes a housing (not shown) to maintain the coolant fluid 220 within the electronic device assembly 200.

In the illustrated embodiment, the electronic device assembly 200 further includes a first thermally conductive feature 232a and a second thermally conductive feature 232b that are located at a first edge 211 and a second edge 213 of the semiconductor device 210, respectively. The first and second thermally conductive features 232a, 232b may be thermally coupled to the surface by a variety of techniques, such as by soldering or brazing, for example. As stated above, a cold plate may be coupled to the surface 212 of the semiconductor device 210 such that the first and second thermally conductive features 232a, 232b are thermally coupled to the cold plate.

The first and second thermally conductive features 232a, 232b define enclosures in which the second phase change material 230 is encased. The first and second thermally conductive features 232a, 232b may be made of a thermally conductive material, such as, but not limited to, copper, aluminum, and thermally conductive polymers. The first and second thermally conductive features 232a, 232b are configured to maintain the second phase change material 230 in close proximity to the surface 212 of the semiconductor device 210 so that it may receive the transient heat flux load. Although the second phase change material 230 is shown on a bottom region of an enclosure 233 defined by the first and second thermally conductive features 232a, 232b, the second phase change material 230 may also be adhered to the top and sidewalls of the first and second thermally conductive features 232a, 232b in actual practice.

When the semiconductor device 210 operates in the normal heat flux state or the transient heat flux state, the temperature of the surface 212 increases to at or above the phase change temperature of the second phase change material 230. The second phase change material 230 absorbs the transient heat flux and changes from a solid to a liquid, and stores the thermal energy generated by the semiconductor device 210 during transient load operation. The liquid of the second phase change material 230 is maintained within the first and second thermally conductive features 232a, 232b. The coolant fluid 220 continues to cool the semiconductor device 210 during the normal heat flux state operation.

In an alternative embodiment, the first phase material 220 is not impinged on the surface 212 of the semiconductor device 210, but rather is pooled between the first and second thermally conductive features 232a, 232b such that the coolant fluid 220 experiences pool boiling during the transient or normal heat flux operating states (i.e., passive cooling rather than active cooling provided by jet impingement).

It should be understood that any number of thermally conductive features may be provided in any number of configurations. The number and arrangement of the thermally conductive features and the encased second phase change material may depend on the particular type of semiconductor device and application, and therefore the thermal load distribution on the surface of the semiconductor device. The second phase change material may be strategically located on the surface of the semiconductor device to absorb any transient heat loads without violating the maximum operating temperature of the semiconductor device.

Figure 3:
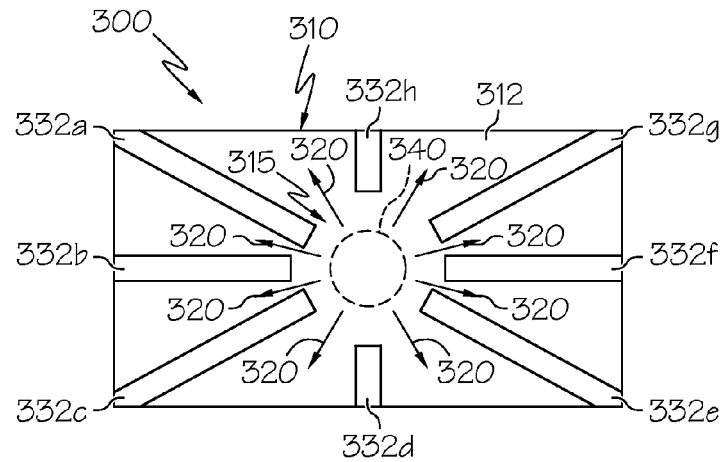
FIG. 3 schematically depicts a top view of an exemplary electronic device assembly having a plurality of radially extending, thermally conductive features containing a phase change material according to one or more embodiments described and illustrated herein.

Referring now to FIG. 3, another exemplary electronic device assembly 300 is schematically depicted. In this embodiment, the thermally conductive features are configured as a plurality of radially arranged, thermally conductive features 332a-332g that is thermally coupled to the surface 312 of the semiconductor device 310. The radially arranged, thermally conductive features 332a-332g may be made of a thermally conductive material, such as, but not limited to, copper, aluminum, and thermally conductive polymers. In the illustrated embodiment, each radially arranged, thermally conductive feature 332a-332g extends from an edge of the surface 312 toward the center. The radially arranged, thermally conductive features 332a-332g terminate at a central region 315 of the surface 312. As described above with respect to FIGS. 2A-2C, the electronic device assembly 300 may further include a jet impingement nozzle 340 that causes coolant fluid 320 to impinge the central region 315 (or other region) of the surface 312 of the semiconductor device 310. Any number of thermally conductive features 332a-332g may be utilized. Additionally, each of thermally conductive features 332a-332g may also include additional branches, such as in a heat sink-like configuration.

As described above with respect to FIG. 2, the second phase change material is encased within each radially arranged, thermally conductive feature 332a-332g. It is noted that the second phase change material is not visible in FIG. 3. As the surface 312 of the semiconductor device reaches the phase change temperature of the second phase change material, the second phase change material changes from a solid to a liquid, and stores thermal energy generated during the transient heat flux state.

In the illustrated embodiment, the first phase change material is configured as a coolant fluid 320 as described above with respect to the embodiment depicted in FIG. 2. The coolant fluid 320 may be directed toward the central region 315 (or other region) of the surface 312 of the semiconductor device 310 by a jet impingement nozzle 340. After impinging the surface 312, the coolant fluid 320 may be directed radially outward, where it may pass by the radially arranged, thermally conductive features 332a-332g, as well as transition from a liquid to a vapor. The coolant fluid 320 may be maintained within the electronic device assembly 300 by a housing (not shown), and removed by an outlet and/or condenser unit (not shown).

The active cooling provided by the coolant fluid 320 cools the semiconductor device 310 during the normal heat flux state (i.e., steady state operation), and the passive cooling provided by the second phase change material cools the semiconductor device during the transient heat flux state.

Embodiments may also be configured such that the first phase change material provides passive rather than active cooling. The first phase change material may be provided in a closed system such that cooling is provided by pool boiling rather than jet impingement. For example, referring to the embodiments depicted in FIGS. 2 and 3, the electrical device assembly may not include a jet impingement nozzle, but rather the coolant fluid may be enclosed in a housing and thermally coupled to the surface of the semiconductor device for pool boiling heat transfer.

Figure 4A:
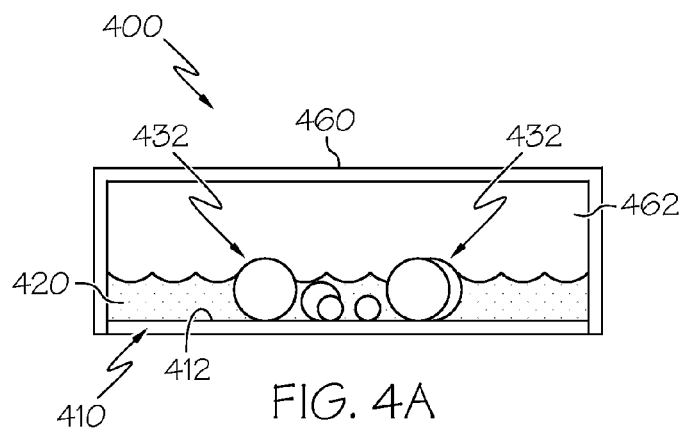
FIG. 4A schematically depicts an internal elevation view of an exemplary electronic device assembly having a plurality of free moving, thermally conductive features containing a phase change material according to one or more embodiments described and illustrated herein.
Figure 4B:
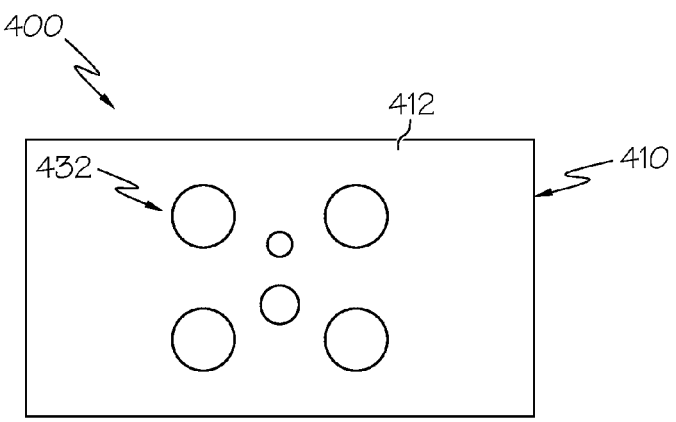
FIG. 4B schematically depicts an internal top view of the exemplary electronic device assembly depicted in FIG. 4A.

FIGS. 4A and 4B schematically depict an exemplary electronic device assembly 400 that utilizes passive cooling for both the first phase change material and the second phase change material. The exemplary electronic device assembly 400 generally comprises a housing 460 that, along with a surface 412 of a semiconductor device 410, defines an enclosure 462 in which the first phase change material is maintained. The first phase change material is configured as a coolant fluid 420 as described above with respect to FIG. 2. The coolant fluid 420 is fluidly coupled to the surface 412 of the semiconductor device 410 to receive heat flux generated by the semiconductor device 410.

The electronic device assembly 400 further comprises one or more freely moving, thermally conductive features 432 disposed in the coolant fluid 420 within the enclosure 462. The freely moving, thermally conductive features 432 are not rigidly coupled to the surface 412 of the semiconductor device 410 (or any intermediate cold plate), and are free to move within the enclosure 462. Each freely-moving, thermally conductive feature 432 defines an enclosure in which second phase change material is encased. The second phase change material may be configured as described above with respect to FIGS. 2 and 3. It is noted that the second phase change material is not visible in FIGS. 4A and 4B.

The freely moving, thermally conductive features 432 may be made of a thermally conductive material, such as, but not limited to, copper, aluminum, and thermally conductive polymers. In the illustrated embodiment, the freely moving, thermally conductive features 432 are configured as spheres in which the second phase change material is disposed. However, the freely moving, thermally conductive features 432 may possess shapes other than spheres. Further, the freely moving, thermally conductive features 432 may have different sizes as depicted in FIGS. 4A and 4B, or they may all have the same size.

When the semiconductor device 410 operates in one or more states such that the temperature of the surface 412 rises to at or above the phase change temperature of the second phase change material, the second phase change material to changes from a solid to a liquid. Additionally, the transient heat flux state and/or the normal heat flux state causes the coolant fluid 420 to boil and change to a vapor. The presence of the freely moving, thermally conductive features 432 within the coolant fluid 420 further facilitates pool boiling of the coolant fluid 420 as they accept the heat flux from the semiconductor device and provide additional nucleation sites.

Figure 5:
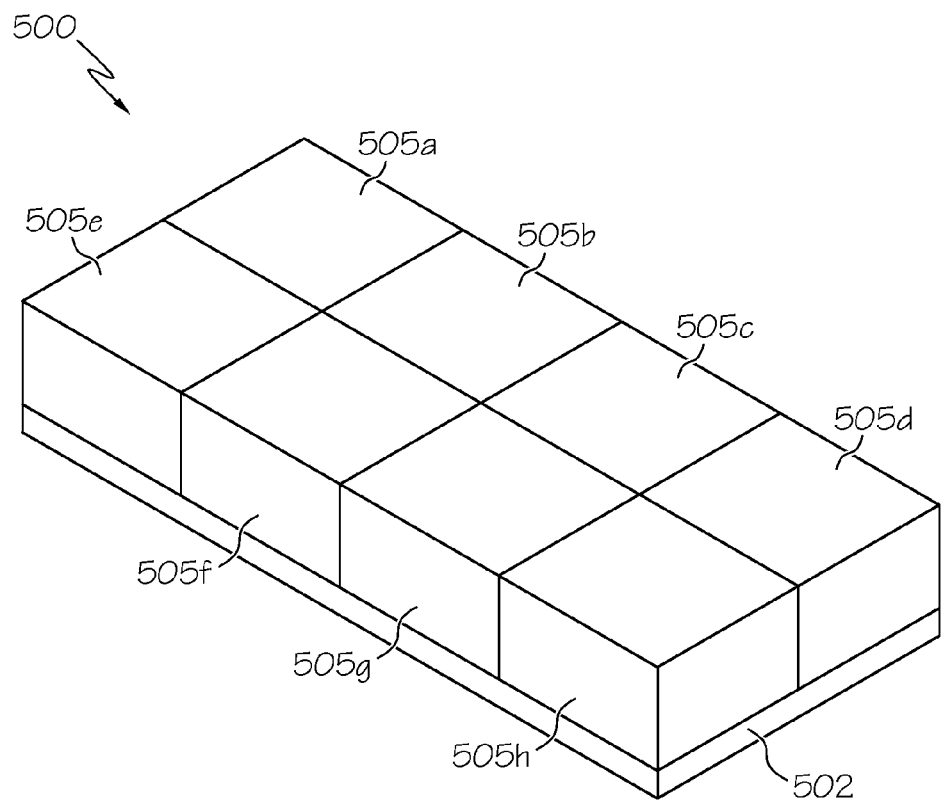
FIG. 5 schematically depicts a perspective view of a power electronics module having a plurality of electronic device assemblies according to one or more embodiments described and illustrated herein.

A plurality of electronic device assemblies as described above may be provided in a power electronics module to create a larger power electronics circuit. FIG. 5 depicts an exemplary power electronics module 500 comprising a plurality of electronic device assemblies 505a-505h. The electronic device assemblies 505a-505h each include a first phase change material and a second phase change material to cool one or more semiconductor devices during at least two heat flux states. In the illustrated embodiment, the plurality of electronic device assemblies 505a-505h is coupled to a thermally conductive substrate 502. In some embodiments, particularly, those using active cooling with a coolant fluid as the first phase change material, the power electronics module 500 may further include coolant fluid inlet and outlet manifolds (not shown) to provide and remove coolant fluid to and from the power electronics module 500.

Figure 6:
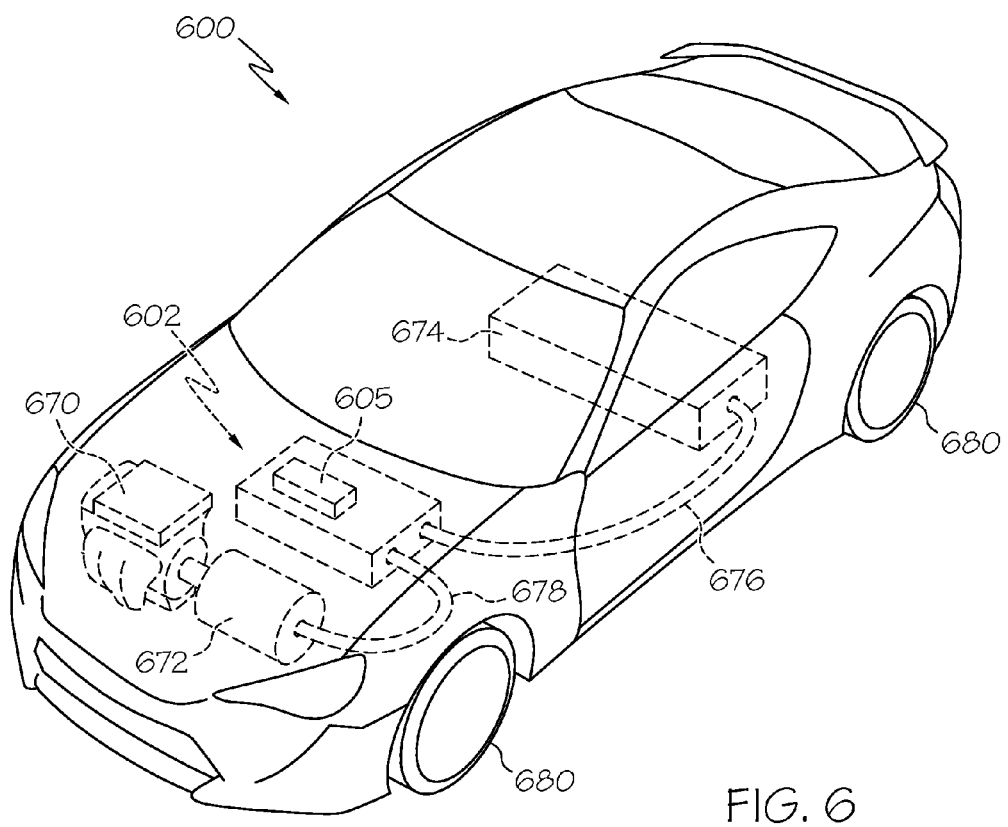
FIG. 6 schematically depicts a perspective view of a vehicle including an electric motor and a power electronics module having a plurality of electronic device assemblies according to one or more embodiments described and illustrated herein.

As stated above, the electronic device assemblies described herein may be incorporated into larger power circuits, such as inverter and/or converter circuits of an electrified vehicle. The electrified vehicle may be a hybrid vehicle, a plug-in electric hybrid vehicle, an electric vehicle, or any vehicle that utilizes an electric motor. Referring now to FIG. 6, a vehicle 600 configured as a hybrid vehicle or a plug-in hybrid vehicle is schematically illustrated. The vehicle generally comprises a gasoline engine 670 and an electric motor 672, both of which are configured to provide rotational movement to the wheels 680 of the vehicle 600 to propel the vehicle 600 down the road. A power circuit 602 is electrically coupled to electric motor 672 (e.g., by conductors 678). The power circuit 602 may be configured as an inverter and/or a converter circuit that provides electrical power to the electric motor 672. The power circuit 602 may in turn be electrically coupled to a power source, such as a battery pack 674 (e.g., by conductors 676). The power circuit 602 includes one or more power electronics modules 605 (see FIG. 5) that include one or more electronic device assemblies. The one or more electronic device assemblies comprise the first phase change material and the second phase change material, as described above. When the semiconductor devices of the one or more power electronics modules 605 operates in one or more of the heat flux states, the second phase change material changes from a solid to a liquid.

It should now be understood that embodiments of the present disclosure are directed to electronic device assemblies employing dual phase change materials to adequately cool a semiconductor device during both normal heat load distributions and transient heat load distributions without over designing the cooling system to accommodate the greater temperatures of the transient heat load distributions. A second phase change material is used as an energy storage device that supplements a main, first phase change material during transient spikes in the heat load during transient operation of the semiconductor device. The second phase change material is efficiently absorbed due to the second phase change material. During normal, steady-state operation, the phase change of the first phase change material, which may be deployed in an active or passive cooling arrangement, cools the semiconductor device.

It is noted that the term "approximately" may be utilized herein to represent the inherent degree of uncertainty that may be attributed to any quantitative comparison, value, measurement, or other representation. Such terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An electronic device assembly comprising:
    a semiconductor device comprising a surface, wherein the semiconductor device operates in a transient heat flux state and a normal heat flux state;
    a housing configured to receive a coolant fluid thermally coupled to the surface of the semiconductor device;
    one or more thermally conductive features thermally coupled to the surface of the semiconductor device and disposed within the housing; and
    a phase change material disposed within the one or more thermally conductive features, the phase change material thermally coupled to the surface of the semiconductor device, the phase change material having a phase change temperature at which the phase change material changes from a first phase to a second phase, wherein the phase change material absorbs heat flux at least when the semiconductor device operates in the transient heat flux state.

2. The electronic device assembly of claim 1, wherein the phase change material is a solid when it is at a temperature below the phase change temperature.

3. The electronic device assembly of claim 1, wherein the one or more thermally conductive features are located at one or more edges of the surface of the semiconductor device.

4. The electronic device assembly of claim 1, wherein the one or more thermally conductive features comprises a plurality of radially arranged thermally conductive features.

5. The electronic device assembly of claim 1, wherein the one or more thermally conductive features are not rigidly coupled to the surface of the semiconductor device.

6. The electronic device assembly of claim 1, wherein the phase change material comprises paraffin wax.

7. The electronic device assembly of claim 1, further comprising a jet impingement nozzle configured to direct the coolant fluid toward the surface of the semiconductor device.

8. The electronic device assembly of claim 7, wherein the coolant fluid impinges a central region of the surface of the semiconductor device.

9. The electronic device assembly of claim 1, wherein:
    the coolant fluid has a fluid phase change temperature at which the coolant fluid changes to a vapor; and
    the fluid phase change temperature is reached when the semiconductor device operates at the normal heat flux state or the transient heat flux state.

10. The electronic device assembly of claim 1, further comprising a cold plate comprising a heated surface and a cooling surface, wherein the surface of the semiconductor device is thermally coupled to the heated surface of the cold plate, and the coolant fluid and the phase change material are thermally coupled to the cooling surface of the cold plate.

11. An electronic device assembly comprising:
    a semiconductor device comprising a surface, wherein the semiconductor device operates in a transient heat flux state and a normal heat flux state;
    a housing configured to receive a coolant fluid thermally coupled to the surface of the semiconductor device, the coolant fluid having a fluid phase change temperature at which the coolant fluid changes to a vapor;
    one or more thermally conductive features thermally coupled to the surface of the semiconductor device, wherein each thermally conductive feature of the one or more thermally conductive features defines an enclosure and the one or more thermally conductive features are disposed within the housing; and
    a phase change material disposed within the enclosures of the one or more thermally conductive features, the phase change material having a phase change temperature at which the phase change material changes from a solid to a liquid.

12. The electronic device assembly of claim 11, wherein the one or more thermally conductive features are made of copper.

13. The electronic device assembly of claim 11, wherein the one or more thermally conductive features are located at one or more edges of the surface of the semiconductor device.

14. The electronic device assembly of claim 11, wherein the one or more thermally conductive features comprises a plurality of radially arranged thermally conductive features.

15. The electronic device assembly of claim 11, wherein the one or more thermally conductive features are not rigidly coupled to the surface of the semiconductor device.

16. The electronic device assembly of claim 11, wherein the phase change material comprises paraffin wax.

17. The electronic device assembly of claim 11, further comprising a jet impingement nozzle configured to spray the coolant fluid toward the surface of the semiconductor device.

18. A vehicle comprising:
    an electric motor; and
    a power electronics module comprising an electronic device assembly, wherein the power electronics module is electrically coupled to the electric motor, and the electronic device assembly comprises:
        a semiconductor device comprising a surface, wherein the semiconductor device operates in a transient heat flux state and a normal heat flux state;
        a housing configured to receive a coolant fluid thermally coupled to the surface of the semiconductor device;
        one or more thermally conductive features thermally coupled to the surface of the semiconductor device and disposed within the housing; and
        a phase change material disposed within the one or more thermally conductive features, the phase change material thermally coupled to the surface of the semiconductor device, the phase change material having a phase change temperature at which the phase change material changes from a first phase to a second phase, wherein the phase change material absorbs heat flux at least when the semiconductor device operates in the transient heat flux state.

19. The vehicle of claim 18, wherein:
    the phase change material is a solid when it is at a temperature below the phase change temperature.

* * * * *